Figure 1:
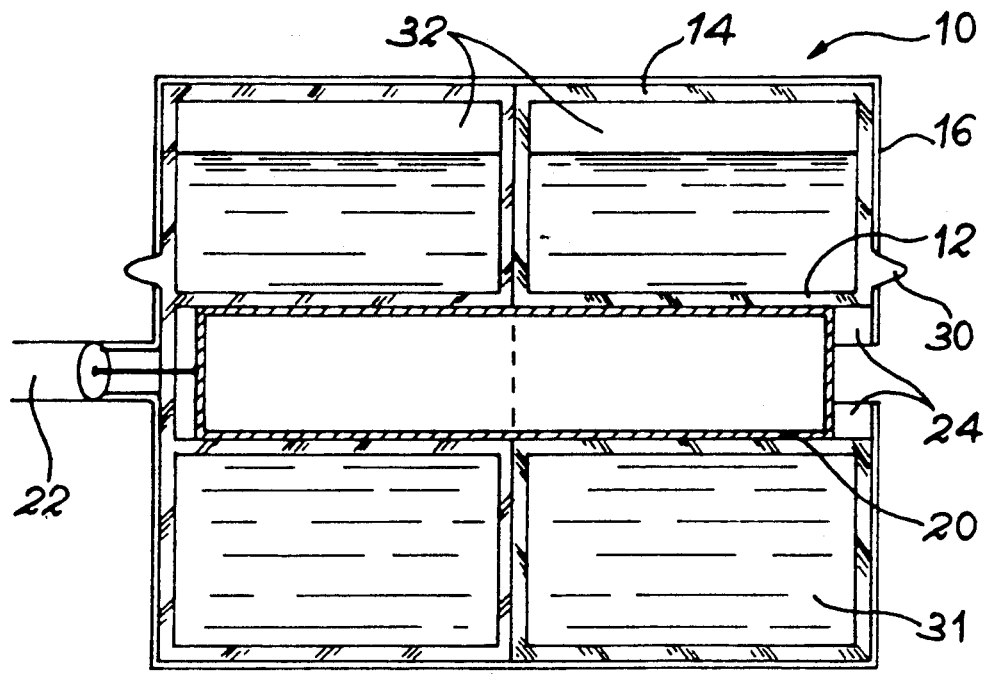

United States Patent

Glenat et al.

[11] Patent Number: 5,103,176
[45] Date of Patent: Apr. 7, 1992

[54] DOUBLE-WALLED BOTTLE FOR NMR PROBE

[75] Inventors: Henri Glenat, Corenc; Nelly Kernevez, Grenoble, both of France

[73] Assignee: Commissariat a l'Energie Atomique, France

[21] Appl. No.: 601,280

[22] Filed: Oct. 22, 1990

[30] Foreign Application Priority Data

Oct. 27, 1989 [FR] France .................. 89 14150

[51] Int. Cl.⁵ .......................................... G01R 33/20
[52] U.S. Cl. ............................... 324/318; 324/300
[58] Field of Search ............ 324/300, 301, 302, 303, 324/307, 309, 318, 322; 128/653 R, 653 A

[56] References Cited

U.S. PATENT DOCUMENTS

| 3,611,118 | 10/1971 | Youngblood | 324/303 |
| 4,126,823 | 11/1978 | Dalton, Jr. | 324/301 |
| 4,225,818 | 9/1980 | Gallop et al. | 324/302 |
| 4,680,546 | 7/1987 | Dumoulin | 324/307 |
| 4,706,024 | 11/1987 | Dumoulin | 324/309 |
| 4,734,645 | 3/1988 | Glenart et al. | 324/301 |

Primary Examiner—Michael J. Tokar
Attorney, Agent, or Firm—Hayes, Soloway, Hennessey & Hage

[57] ABSTRACT

The bottle according to the invention comprises a double wall (34, 36) defining a coaxial volume (38) corresponding to the "bubble" to be left after filling. In normal operation, the liquid is ejected from said volume and occupies the remainder of the bottle.

3 Claims, 2 Drawing Sheets

DOUBLE-WALLED BOTTLE FOR NMR PROBE

DESCRIPTION

The present invention relates to a bottle for a nuclear magnetic resonance magnetometer probe (NMR). It is used in the precise measurement of magnetic fields, particularly the earth's magnetic field. The magnetometer in which the probe according to the invention is used in preferred manner is of a known type and is described in FR-A-1 447 226 and FR-A-2 098 264. Therefore it will not be described in detail. It is sufficient to point out that is comprises one or more liquid sample bottlers located in a coaxial resonant cavity. The latter is constituted by a central conductor traversing the bottle and an outer conductive wall around the bottle. The probe comprises windings for the sampling and reinjection of a signal at the LARMOR frequency, which is defined on the one hand by the magnetic field in which the probe is located and on the other by the gyromagnetic ratio of the liquid sample used. One of the ends of the central conductor is connected to frequency tuning capacitors and the other to a very high frequency (VHF) generator.

The solvents used in the liquid samples for obtaining these probes must generally have special physical characteristics, namely freezing point below approximately $-50°$ C., boiling point above approximately $70°$ C. and even $125°$ C. in special applications, low viscosity and the maximum proton relaxation time.

In order to absorb the volume variations of these liquids in the operating temperature range, it is vital to leave a "vacuum bubble" in the bottle (approximately 8% of the total volume at a temperature of $20°$ C. for the solvents used). This bubble enables the solvent to expand, without a high pressure being exerted on the bottle, which could lead to a risk of the latter exploding. In actual fact the bubble contains solvent vapour.

As a function of the orientation in space of the probe, the bubble occupies different positions in the bottle and can be located in the vicinity of the high signal efficiency regions, such as those in the vicinity of the sampling windings. This has the effect of reducing the signal-to-noise ratio, whilst increasing the noise when the probe is moving. Moreover, when the bubble is located in the vicinity of the tuning capacitors, the dielectric coefficient of the solvent possibly being very high (33 for methanol), said bubble will modify the total capacitance and detune the cavity. This will lead to reductions to the internal VHF field, the polarization coefficient and the amplitude of the signal. The reduction in the signal-to-noise will lead to the appearance of parasitic effects linked more particularly with the anisotropy of the probe and the background noise will increase.

FIG. 1 indicates the shape of the bottles used in the prior art. The bottles shown are cylindrical, but other shapes are also possible (hemispherical with flat portion, conical, etc.).

The bottle 10 comprises a cylindrical inner wall 12 leaving a duct for the passage of the central conductor of the resonator and an outer wall 14. The resonator is defined on the one hand by a conductive layer 16 placed on the outer wall 14 and on the other by the conductor 20 occupying the duct defined by the wall 12. This conductor is connected at one of its ends to a coaxial supply cable 22 and at the other of its ends to tuning capacitors 24.

The bottle is filled by a pumping lead 30. After filling, the liquid volume 31 does not totally occupy the bottle and a bubble 32 must be left. Although this bubble is indispensable, it leads to certain problems. As indicated hereinbefore, it firstly leads to a signal loss when the probe is oriented in such a way that the bubble is located in an area where the efficiency of the liquid is high. It also leads to an anisotropy of the probe, because the symmetry of revolution of the assembly is broken. Finally, it leads to a filling problem, because it is not easy to calibrate the volume left free.

The object of the present invention is to obviate these disadvantages. To this end, it proposes a simple means ensuring that, during operation, the bubble is located in an area only contributing slightly to the measuring signal and so that the isotropy of the probe is maintained and finally so as to simplify the filling operation.

These objects are achieved according to the invention by the use of a bottle, whose essential characteristic is that the inner wall is constituted by a double wall defining a coaxial volume substantially corresponding to the empty volume which has to be left after filling. The outer wall of said double wall has at least one opening linking the coaxial volume with the remainder of the bottle.

The objectives of the invention are achieved by such an arrangement. Thus, during operation, the bubble will occupy the volume defined by the double wall, i.e. the area surrounding the central conductor and which is relatively inactive. Therefore the signal loss will be limited. The shape of revolution of the empty volume will preserve the symmetry of the probe. Finally, filling will be easy, because at a given temperature it is only necessary to fill the main volume, whilst leaving empty the coaxial part defined by the double wall. At this temperature, the volume defined by the double wall is liquid-free and also makes it possible to avoid detuning of the cavity at this temperature.

The invention is described in greater detail hereinafter relative to non-limitative embodiments and the attached drawings, wherein show:

FIG. 1 Already described, prior art NMR probe bottles.

Figure 2:
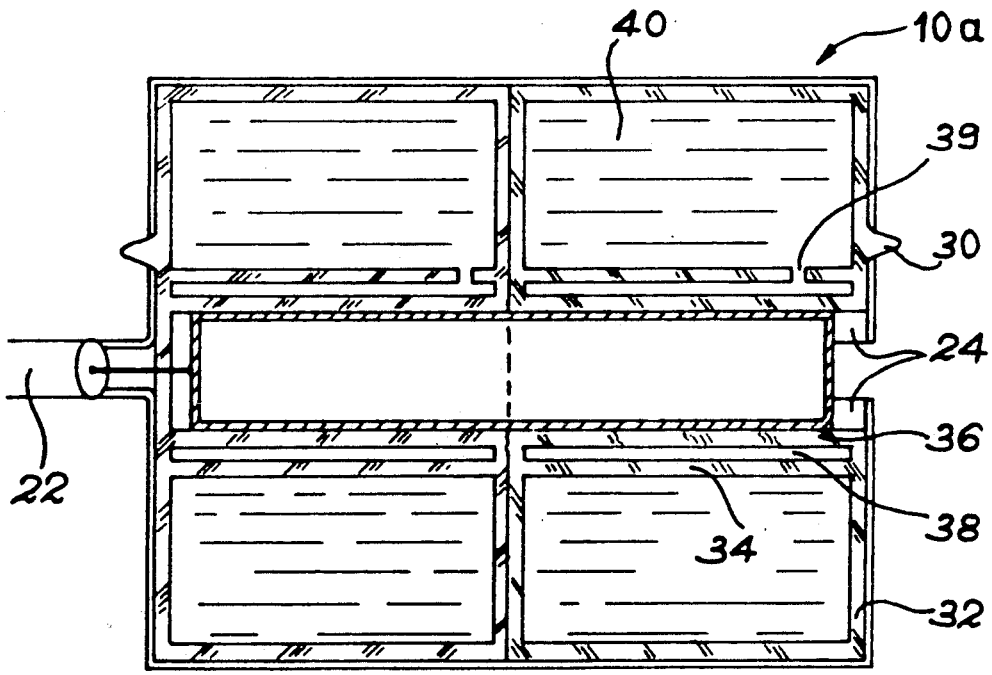

FIG. 2 Bottles according to the invention in a cylindrical variant.

Figure 3:
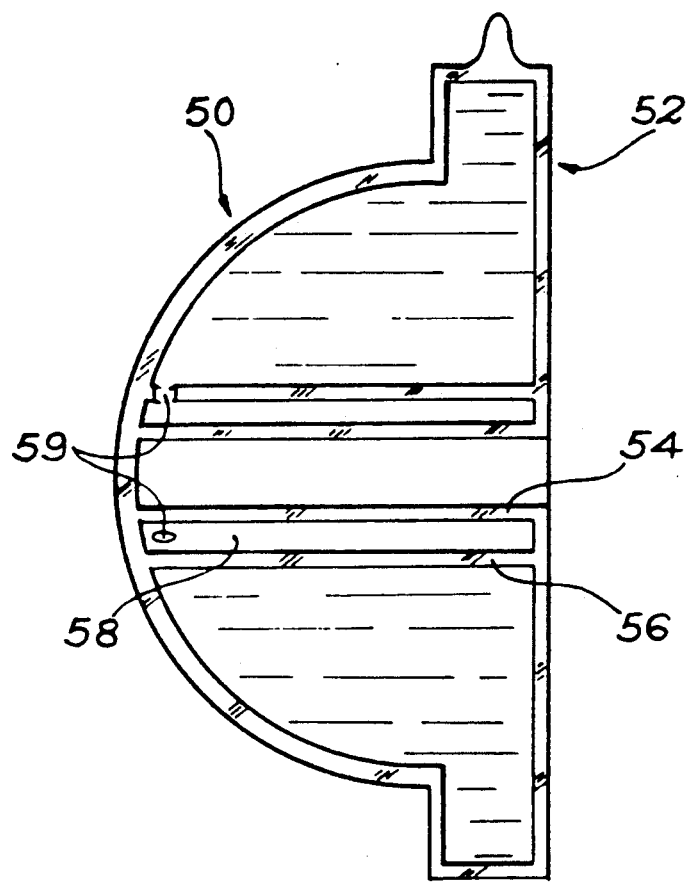

FIG. 3 A bottle according to the invention in a hemispherical variant with a flat portion.

FIG. 2 shows a bottle 10a with an outer cylindrical wall 32 and an inner wall constituted by a double wall 34, 36 giving a coaxial volume 38. The diameter of these two walls 34, 36 is defined in such a way that the volume of the space which they define is substantially equal to the vacuum which it is wished to leave in the bottle after filling, i.e. approximately 8%. The outer wall 34 has an opening 39 linking the volume 38 with the main volume 40 of the bottle. It is possible to provide several individual holes and their diameter will be approximately 1 to 2 mm.

It is also possible to see the central conductor 20 occupying the duct defined by the wall 36 and various equipments (cable 22, capacitors 24).

The VHF power supplied to the liquid in order to excite the dynamic polarization phenomenon is partly lost by the Joule effect in the central conductor 20, so that within said area there is a slight temperature rise during the putting into operation of the probe. This rise is firstly felt in the volume 38 within the double wall. This leads to a slight pressure rise, which has the effect of partly or totally, as a function of the temperature used, expelling the liquid through the opening 39 towards the main volume 40.

This phenomenon of ejecting liquid from the central area 38 towards the peripheral area 40 is virtually instantaneous for the solvents generally used in NMR (such as tetrahydrofuran or THF). The lower the operating temperature the higher the speed of this phenomenon.

In normal operation, the liquid consequently occupies the main volume 40, as shown in FIG. 2. The coaxial space 38 of the double wall is empty at the filling temperature, which takes the place of the "bubble". However, unlike in the prior art, said "bubble" is coaxial and therefore perfectly symmetrical.

The present invention can be applied to any bottle shape (hemispherical, cylindrical, conical, etc.), provided that there is an inner cylindrical wall defining a passage for the central conductor of the resonator.

Thus, FIG. 3 shows a bottle according to the invention with a hemispherical portion 50 and a flat portion 52. The double wall 54, 56 defines a coaxial volume 58 and the outer tube 56 has three holes 59 at 120° from one another, for the ejection of liquid into the main volume.

The bottle can be made from any material known for this application, e.g. Pyrex glass.

We claim:

1. Bottle for nuclear magnetic resonance probe, comprising an inner cylindrical wall (12) leaving a duct for the passage of a central conductor (20) and an outer wall (14), said bottle being intended to be incompletely filled with liquid (31), an empty volume (32) being left after filling, said bottle being characterized in that the inner wall is constituted by a double wall (34, 36, 54, 56) defining a coaxial volume (38, 58) substantially corresponding to the empty volume to be left after filling, the outer wall (34) of the double wall having at least one opening (39, 59) for linking the coaxial volume (38, 58) with the remainder of the bottle.

2. Bottle according to claim 1, characterized in that the outer wall (30) is cylindrical.

3. Bottle according to claim 1, characterized in that the bottle has a generally hemispherical (50) shape with a flat portion (52).

* * * * *